(12) United States Patent
Lin

(10) Patent No.: US 6,184,090 B1
(45) Date of Patent: Feb. 6, 2001

(54) FABRICATION METHOD FOR A VERTICAL MOS TRANSISTOR

(75) Inventor: Benjamin Szu-Min Lin, Hsinchu (TW)

(73) Assignees: United Microelectronics Corp; United Silicon Incorporated, both of Hsinchu (TW)

(*) Notice: Under 35 U.S.C. 154(b), the term of this patent shall be extended for 0 days.

(21) Appl. No.: 09/421,308

(22) Filed: Oct. 20, 1999

(51) Int. Cl.[7] .................................................. H01L 21/336

(52) U.S. Cl. ................................................ 438/269; 257/328

(58) Field of Search ................................. 438/268, 269, 438/270, 221; 257/301, 302, 135, 328; H01L 21/3105, 21/336, 29/423, 29/78

(56) References Cited

U.S. PATENT DOCUMENTS 5,891,770 * 4/1999 Lee .......................................... 438/221

FOREIGN PATENT DOCUMENTS 196 21 244A1 * 11/1996 (DE) ...................................... 438/197

* cited by examiner

*Primary Examiner*—Amir Zarabian
*Assistant Examiner*—Christian D. Wilson
(74) *Attorney, Agent, or Firm*—Thomas, Kayden, Horstemeyer & Risley

(57) ABSTRACT

A fabrication method for a vertical MOS device is described, in which dopants are implanted in the active region to form, from the bulk to the surface of the wafer respectively, a first doped layer, a second doped layer and a third doped layer. A portion of the isolation structure above the first doped layer is then removed, exposing the sidewalls of the second doped layer and the surface of the third doped layer but still concealing the first doped layer in the substrate. A gate oxide layer is further formed on the sidewalls of the second doped layer and the surface of the third doped layer. Furthermore, a conductive layer is formed at the second doped layer, covering the isolation structure, wherein the second doped layer and the conductive layer are isolated by the gate oxide layer.

12 Claims, 2 Drawing Sheets

FABRICATION METHOD FOR A VERTICAL MOS TRANSISTOR

BACKGROUND OF THE INVENTION

1. Field of the Invention

This invention relates to a fabrication method for a vertical metal oxide semiconductor (MOS) transistor. More particularly, the invention relates to a fabrication method for a MOS transistor comprising a vertical channel.

2. Description of the Related Art

In the design for the very large scale integration (VLSI), the dimensions for the transistor device are continuously being reduced to increase the integration. A critical point in the manufacturing of a transistor with small dimension is the reduction of the channel length. To effectively reduce the channel length of a MOS transistor is a very important issue.

Conventionally, the channel length is defined by the photolithography technique. The current photolithography technique development, however, is limited by, for example, the wavelength of the light source, the material and thickness of the photoresist layer, the scattering and deflection properties of light. For the manufacturing of a line width of 0.25 micron and below, it is, therefore, difficult to control the channel length by means of photolithography.

Comparing to the photolithography technique, the development of the thin film deposition and the ion implantation technology are more advance, for example, chemical vapor deposition (CVD) can accurately control the thickness of the deposited thin film to a few angstrom.

SUMMARY OF THE INVENTION

In the light of the foregoing, the present invention provides a fabrication method for a vertical MOS transistor in which the channel length is effectively reduced to raise the integration of the device.

The present invention also provides a fabrication method for a vertical MOS transistor in which the channel length can be accurately controlled.

The present invention further provides a fabrication method for a vertical MOS transistor by using ion implantation to form the source region, the channel region and the drain region and by using deposition to form the gate to accurately control the channel length.

The fabrication method for a vertical MOS transistor according to the present invention includes the following steps. An isolation structure is formed in the substrate to define the active region. Ion implantation is then conducted to form, from the bulk to the surface of the wafer respectively, a first doped layer (for example, a source region), a second doped layer (for example, a channel region) and a third doped layer (for example, a drain region), wherein the dopant of the second doped layer is of a different conductive type than that of the third layer and the first doped layer. Furthermore, the first, second, and third layers are not formed in any particular orders. In another words, as long as the dopant concentration of each doped layer is accurately controlled, the order of forming the doped layers is not pertinent.

Thereafter, a portion of the isolation structure above the first doped layer is removed, exposing the sidewalls of the second doped layer and the third doped layer and the upper surface of the third doped layer, wherein the first doped layer is still being concealed in the substrate. A gate oxide layer is formed on the exposed surface and sidewalls of the second doped layer and the third doped layer. A conductive layer is further formed at the sidewall of second doped layer and on the substrate, covering the isolation structure, wherein the second doped layer and the conductive layer are isolated by the gate oxide layer. This conductive layer can be used as a gate conductive layer.

An important point to note is that the thickness of the gate conductive layer can be controlled to have the same or different thickness from that of the second doped layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

The present invention provides a fabrication method for a vertical MOS transistor, in which ion implantation and thin film deposition techniques are employed to form the vertical MOS transistor and with the channel length being accurately controlled.

FIGS. 1A to 1E are schematic, cross-sectional views showing the fabrication of a vertical MOS transistor according to the preferred embodiment of the present invention.

Figure 1A:
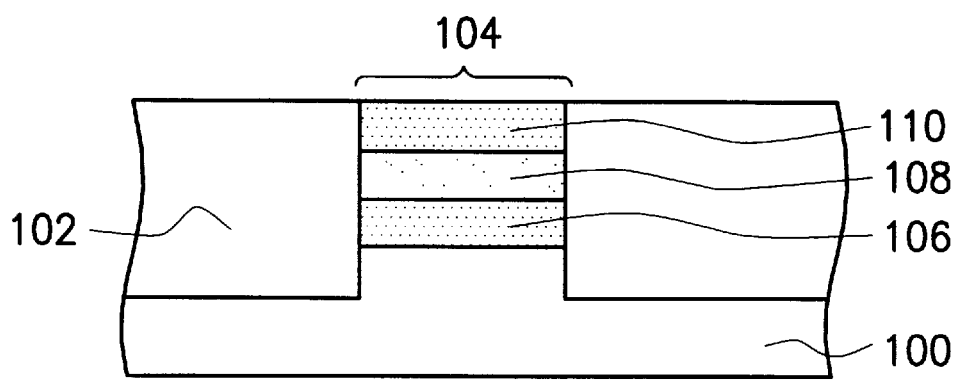
FIGS. 1A to 1E are schematic, cross-sectional views showing the fabrication of a vertical MOS transistor according to the preferred embodiment of the present invention.

Referring to FIG. 1A, a semiconductor substrate 100 is provided. An isolation structure 102, for example, a shallow trench isolation structure, is formed in the substrate 100 to define the active region 104.

An ion implantation is conducted on the active region 104 to form, from the bulk to the surface of the substrate, a first doped layer (for example, a source region layer) 106, a second doped layer (for example, a channel layer) 108 and a third doped layer (for example, a drain region layer) 110 respectively. Method to form the doped layers includes conducting three different ion implantation procedures each with a different dosage of ion to form at the various depths in the substrate the source region layer 106, the channel layer 108 and the drain region layer 110. The ions implanted in the channel layer 108 is of a different conductive type than those implanted in the source region layer 106 and the drain region layer 110, for example, if the channel layer 108 is implanted with the p type ion, the source region layer 106 and the drain region layer 110 are implanted with the n type ion or vice versa. The order in forming the source region layer 106, the channel layer 108 and the drain region layer 110 is not restricted.

Figure 1B:
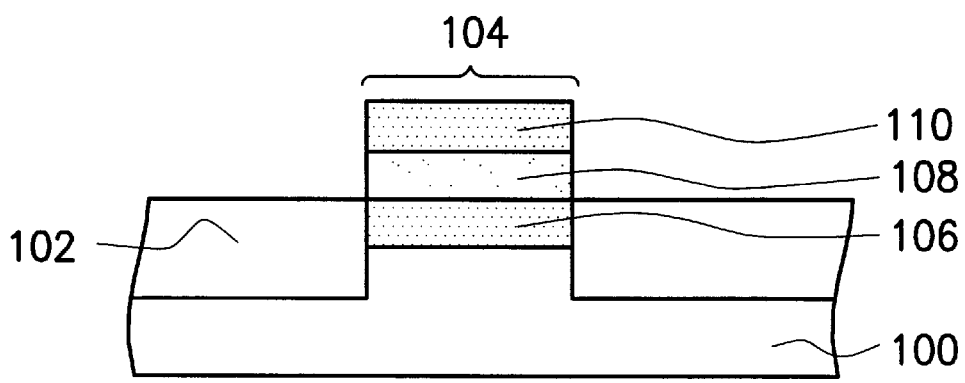

The isolation structure 102 above the source region layer 106 is removed, as depicted in FIG. 1B, exposing the top surface of the drain region layer and the sidewalls of the drain region layer 110 and the channel layer 108, wherein the source region layer 106 is still concealed in the substrate 100. The isolation structure 102 is partially removed by, for example, anisotropic etching.

Figure 1C:
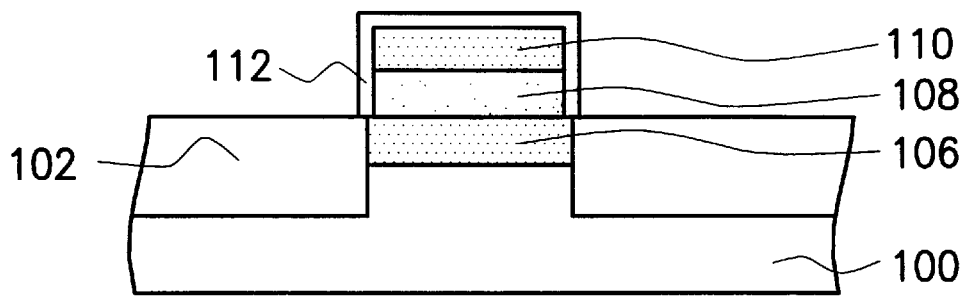

Referring to FIG. 1C, a gate oxide layer 112 is formed, for example, by thermal oxidation, on the exposed surface of the drain region layer 110 and exposed sidewalls of the channel layer 108 and the drain region layer 110.

Figure 1D:
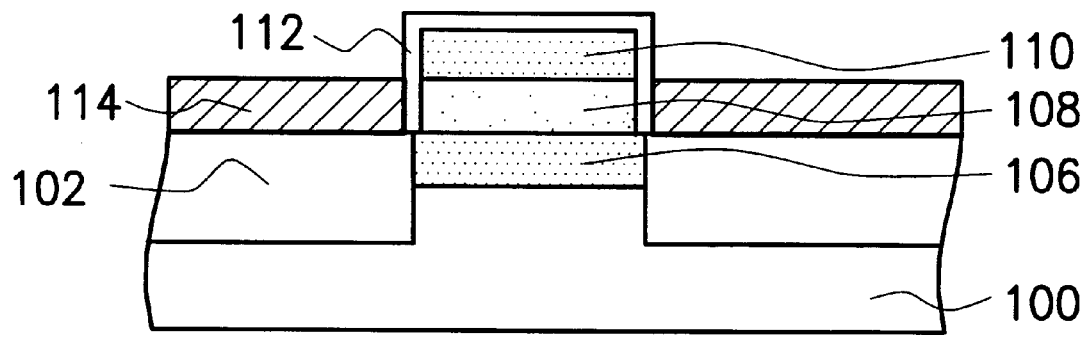

As shown in FIG. 1D, a conductive layer 114 is formed on the substrate 100 at the sidewall of the channel layer 108, covering the isolation structure 102. The conductive layer 114, including a doped polysilicon layer, is formed by, for example, chemical vapor deposition to form a conductive layer (such as a doped polysilicon layer, not shown in Figure) to cover the active region 104 and the isolation structure 102. A polishing, for example, chemical mechanical polishing, is further conducted to remove the conductive layer until the gate oxide layer 112 on the top surface and the sidewall of the drain region layer 110 is exposed.

Figure 1E:
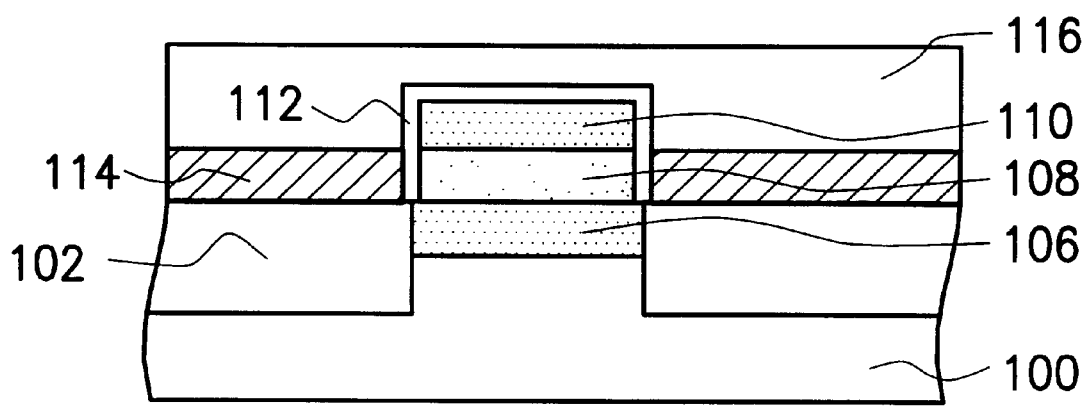

As shown in FIG. 1E, a dielectric layer 116 is formed on the substrate 100 and the gate oxide layer 112 surface for the subsequent manufacturing of other devices. In the present preferred embodiment, the drain region 110 is located above the source region 106. However, the locations for the source and the drain regions can be interchanged without affecting the device performance.

According to the preferred embodiment of the present invention, the channel region and the source/drain region are formed by ion implantation, the length of the channel region is thus determined by the ion implantation technique. Based on the current ion implantation technology, it is easy to accurately control the channel length to under 0.15 micron. With the continuous advancement of the ion implantation technology, a channel length under 0.1 micron can be achieved, which is not easily accomplished by the photolithography technique. In addition, the gate conductive layer is formed by chemical vapor deposition, its thickness (the width of the gate) can be controlled to about between 10 angstrom and 100 angstrom, similar to that formed by the conventional photolithography process. The present invention can also provide a smaller and a more accurate of the gate width.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A fabrication method for a vertical metal oxide semiconductor transistor, the method comprising the steps of:

forming an isolation structure in a substrate to define an active region;

conducting a first doping process to form a first doped layer in the active region;

conducting a second doping process to form a second doped layer in the active region, wherein the second doped layer is formed on the first doped layer;

conducting a third doping process to form a third doped layer in the active region, wherein the third doped layer is formed on the second doped layer, and a surface of the third doped layer is exposed on a surface of the substrate, and wherein the conductive type of a doped layer is different from the conductive type of a dopant for the first doped layer and the third doped layer;

removing a portion of the isolation structure down to a surface level of the first doped layer, exposing a surface of the third doped layer and sidewalls of the second doped layer and third doped layer, but concealing the first doped layer forming a gate oxide layer on exposed sidewalls and surface of the second doped layer and the third doped layer, respectively; and forming a conductive layer at the sidewalls of the second doped layer and on the substrate to cover the isolation structure, wherein the second doped layer and the conductive layer are isolated by the gate oxide layer.

2. The fabrication method for a vertical metal oxide semiconductor transistor according to claim 1, wherein the conductive layer and the second doped layer have substantially same thicknesses.

3. The fabrication method for a vertical metal oxide semiconductor transistor according to claim 1, wherein the conductive layer includes a doped polysilicon layer.

4. The fabrication method for a vertical metal oxide semiconductor transistor according to claim 1, wherein a formation of the conductive layer further includes:

forming a doped conductive layer to cover the active region and the isolation structure;

chemical mechanical polishing the conductive layer until the gate oxide layer on the active region is exposed; and back-etching the doped conductive layer until a remaining thickness of the conductive layer is same as a thickness of the second doped layer.

5. The fabrication method for a vertical metal oxide semiconductor transistor according to claim 1, wherein the gate oxide layer is formed by thermal oxidation.

6. A fabrication method for a vertical metal oxide semiconductor transistor, the method comprising the steps of:

forming an isolation structure in a substrate to define an active region;

conducting an ion implantation in the active region to form, from a bulk to a surface of the substrate respectively, a first doped layer, a second doped layer and a third doped layer, wherein the second doped layer is of a first conductive type, and the first and the third doped layers are of a second conductive type;

removing a portion of the isolation structure on the first doped layer, exposing a surface of the first doped layer, and sidewalls of the first doped layer and the second doped layer but concealing the third dope layer;

forming a gate oxide layer on an exposed surface of the first doped layer and exposed sidewalls of the first doped layer and the second doped layer; and forming a conductive layer at the sidewall of the second doped layer covering the isolation structure, wherein the second doped layer and the conductive layer are isolated by the gate oxide layer.

7. The fabrication method for a vertical metal oxide semiconductor transistor according to claim 6, wherein the conductive layer and the second doped layer have substantially same thicknesses.

8. The fabrication method for a vertical metal oxide semiconductor transistor according to claim 6, wherein the conductive layer includes a doped polysilicon layer.

9. The fabrication method for a vertical metal oxide semiconductor transistor according to claim 6, wherein a formation of the conductive layer includes:

forming a conductive layer to cover the active region and the isolation structure;

chemical mechanical polishing the conductive layer until the gate oxide layer on the active region is exposed; and back-etching the doped conductive layer until a remaining of the conductive layer has a same thickness as the second doped layer.

10. The fabrication method for a vertical metal oxide semiconductor transistor according to claim 6, wherein the gate oxide layer is formed by thermal oxidation.

11. The fabrication method for a vertical metal oxide semiconductor transistor according to claim 6, wherein the first conductive type is different from the second conductive type.

12. A fabrication method for a vertical metal oxide semiconductor device, the method comprising the steps of:

forming an isolation structure to define an active region in a substrate;

conducting a first doped process to form a source region layer in the active region;

conducting a second doped process to form a channel layer in the active region, wherein the channel layer is formed on the source region layer;

conducting a third doped process to form a drain region layer in the active region, wherein the drain region layer is formed on the channel layer, and the drain layer is exposed on a surface of the substrate;

removing a portion of the isolation structure above the drain region layer, exposing the channel layer and a sidewall of the drain layer but concealing the source region layer in the substrate;

forming a gate oxide layer on exposed surfaces of the channel layer and the drain region layer;

forming a doped polysilicon layer on a sidewall of the channel layer covering the isolation structure and isolating the second doped layer and the doped polysilicon layer with the gate oxide layer.

* * * * *